United States Patent [19]

Sanders

[11] Patent Number: 5,338,397
[45] Date of Patent: Aug. 16, 1994

[54] METHOD OF FORMING A SEMICONDUCTOR DEVICE

[75] Inventor: Paul W. Sanders, Scottsdale, Ariz.

[73] Assignee: Motorola, Inc., Schaumburg, Ill.

[21] Appl. No.: 130,482

[22] Filed: Oct. 1, 1993

[51] Int. Cl.$^5$ .............. H01L 21/306; B44C 1/22; C23F 1/00

[52] U.S. Cl. ................... 156/659.1; 156/656; 156/904; 430/313; 430/318; 437/51; 437/180; 437/245

[58] Field of Search ............ 156/656, 659.1, 661.1, 156/662, 904; 430/296, 312, 313, 318; 437/50, 51, 180, 228, 245

[56] References Cited

U.S. PATENT DOCUMENTS 5,100,508  3/1992  Yoshida et al. ............ 156/659.1
5,221,429  6/1993  Makuta ...................... 156/661.1

OTHER PUBLICATIONS

James B. Brinton, "E-Beam, Ultraviolet Photolithography Join In Single-Resist Step For Precision, Speed", Electronics, pp. 40–41, Nov. 30, 1981.

*Primary Examiner*—William Powell
*Attorney, Agent, or Firm*—Robert F. Hightower; William E. Koch

[57] ABSTRACT

The present invention provides a method of forming a semiconductor device. A layer of photoresist is applied to a semiconductor wafer. A first mask is used to protect a first portion of the photoresist while a second portion of the photoresist is exposed. A second mask is used to expose a third portion of the photoresist wherein the third portion of the photoresist includes part of the first portion of the photoresist. The photoresist is developed to form a photoresist mask.

19 Claims, 3 Drawing Sheets

METHOD OF FORMING A SEMICONDUCTOR DEVICE

BACKGROUND OF THE INVENTION

The present invention relates, in general, to semiconductor devices, and more particularly, to a novel method of forming electrical connections between elements of a semiconductor device.

In the past, the semiconductor industry has utilized a variety of methods to interconnect the various elements used in forming a semiconductor device. Radio frequency (R. F.) power devices is one family of semiconductor devices that generally are formed by such methods. Typically, R. F. power devices are formed by connecting a large number of small individual transistors together in parallel. The amount of current to be carried by the R. F. power device determines the number of small transistors that are used.

One problem with large R. F. power devices is the area required to form the conductor or interconnect pattern. Generally, the reticle of a wafer stepping exposure system is used as a mask to expose photoresist on a semiconductor wafer. Often the pattern to be exposed is too large to fit onto one reticle of a wafer stepping exposure system. Consequently, the interconnect pattern is split into two overlapping sections that fit onto two separate stepper reticles. Using two reticles to form a conductor interconnect mask typically requires several critical alignments to ensure registration of the two images resulting from the two reticles. Such multiple exposures require precise alignment between the two images formed by the two stepper reticles. Also, the multiple exposures require twice as much time to expose the entire interconnect pattern thereby increasing manufacturing costs. Additionally, two sets of stepper reticles must be maintained thereby further increasing manufacturing costs.

Accordingly, it is desirable to have a method of forming large semiconductor devices that does not require more than one stepper reticle, that does not require precise alignment, and that reduces manufacturing costs.

SUMMARY OF THE INVENTION

Briefly stated, the present invention includes forming a semiconductor device by applying a layer of photoresist to a semiconductor wafer. A first mask is used to protect a first portion of the photoresist while a second portion of the photoresist is exposed. A second mask is used to expose a third portion of the photoresist wherein the third portion of the photoresist includes part of the first portion of the photoresist. The photoresist is developed to form a photoresist mask.

DETAILED DESCRIPTION OF THE DRAWINGS

Figure 1:
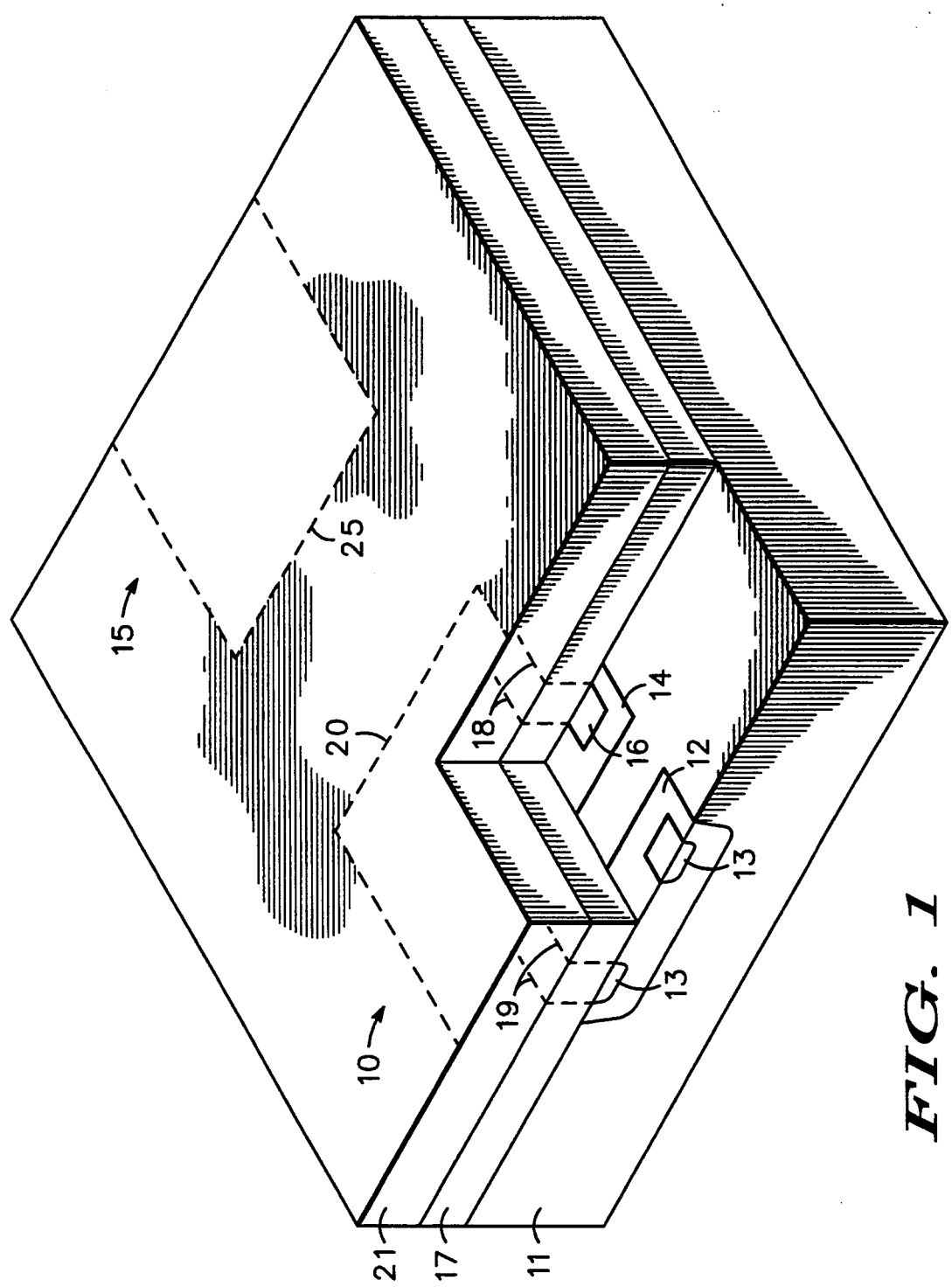
FIG. 1 is an enlarged perspective cut-away view illustrating a stage in forming a semiconductor device in accordance with the present invention.

FIG. 1 illustrates a stage in forming a semiconductor device 10 and a semiconductor device 15 on a semiconductor substrate or wafer 11. Because the surface of wafer 11 is covered with various layers, a set of dashed lines 20 and 25 illustrate the approximate locations of devices 10 and 15, respectively. Wafer 11 may include more than two devices, but only two are illustrated for clarity of the explanation. A plurality of individual semiconductor elements 12 and 14 are formed on substrate 11 to function as basic unconnected elements that will subsequently be connected to form device 10. Elements 12 and 14 can be passive elements or active semiconductor devices such as individual unconnected transistors. Although device 10 may include more than two elements, only two are shown for clarity. Elements 12 and 14 typically are organized in a regular geometric pattern that facilitates interconnecting elements 12 and 14 to form device 10. In the preferred embodiment, elements 12 and 14 are two unconnected transistors of a plurality of unconnected transistors that are arranged into a row or straight line. Ohmic contact areas 13 and 16 are low resistance areas within elements 12 and 14, respectively, that facilitate forming ohmic contact to elements 12 and 14. Device 15 generally includes similar elements that are arranged consistently with the geometric pattern used for device 10.

After forming elements 12 and 14, a conductor or interconnect layer 17 typically is applied to cover substrate 11. A portion of layer 17 that overlays contacts 13 and 16 will subsequently be utilized to form a plurality of interconnect stripes, illustrated by dashed lines 18 and 19, that electrically connect elements 12 and 14. Interconnect layer 17 is covered with a layer of photoresist 21 that subsequently will be patterned to create a mask used in forming the plurality of interconnect stripes.

Figure 2:
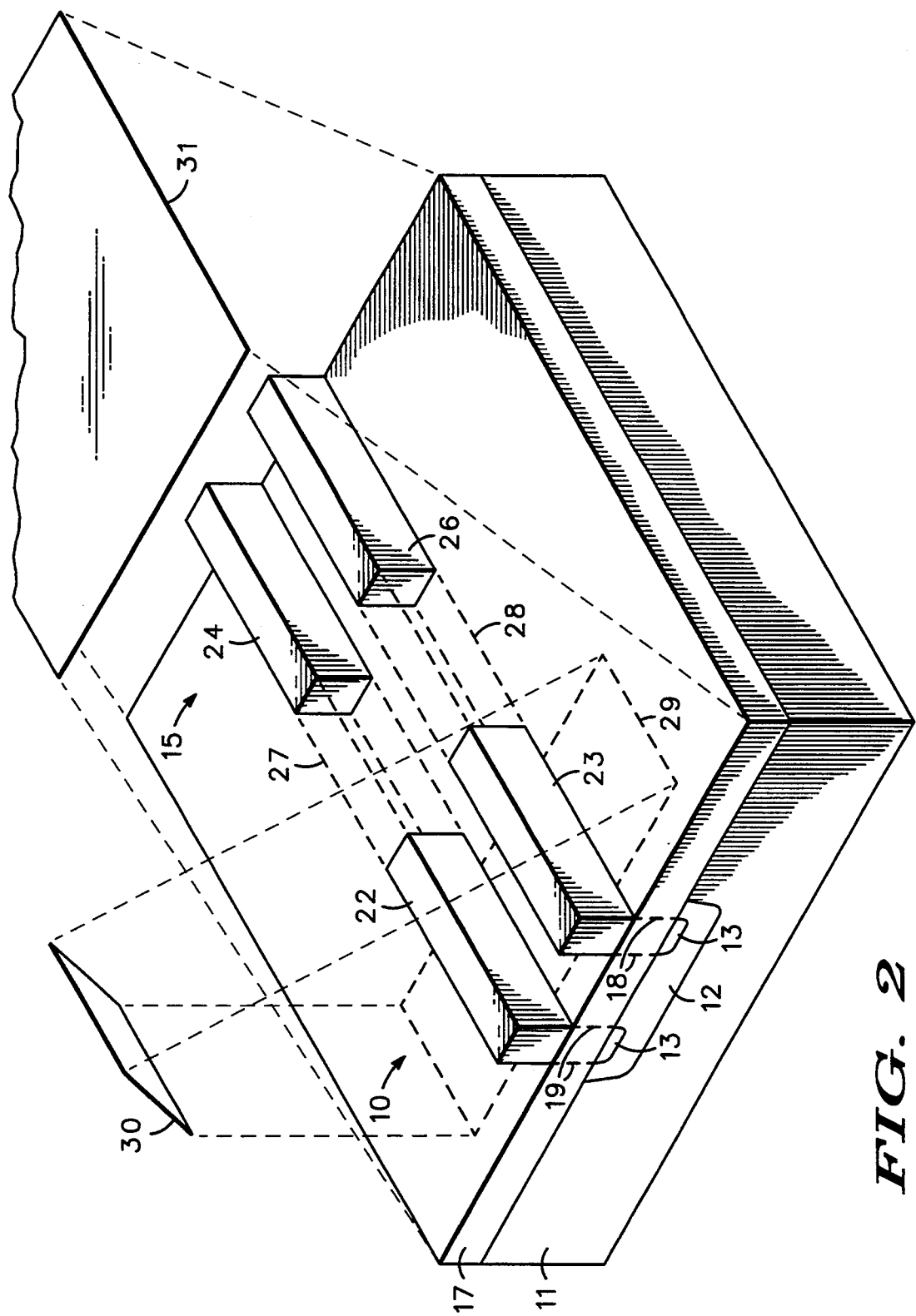
FIG. 2 illustrates the semiconductor device of FIG. 1 at a subsequent stage in accordance with the present invention.

FIG. 2 is an enlarged perspective view showing devices 10 and 15 after forming photoresist 21 (FIG. 1) into a photoresist mask that includes photoresist mask elements 22, 23, 24, and 26. Elements of FIG. 2 are the same as FIG. 1 have the same reference numerals. Also, the discussion of FIG. 2 contains numerous references to photoresist 21 (FIG. 1). Elements 22, 23, 24, and 26 are formed by a novel multiple exposure technique utilizing a single stepper reticle 30 as a first mask and a single contact mask 31 as a second mask. A positive photoresist typically is required to implement such subtractive exposures. One stepper reticle is used even though the completed interconnect pattern of device 10 may be too large to fit onto the single reticle. In the preferred embodiment, the maximum stepper reticle pattern projected onto photoresist 21 is approximately 6 to 7 millimeters square while device 10 is over 7 millimeters square. The reticle pattern corresponds to only a horizontal section or portion of elements 22 and 23. A dashed box 29 illustrates one such horizontal section that can be exposed by reticle 30. Since the area exposed by reticle 30 is smaller than the area covered by device 10, more than one step of reticle 30 is required to expose the portion of photoresist 21 corresponding to device 10. As the exposure pattern formed by reticle 30 steps along photoresist 21, reticle 30 protects the portions of photoresist 21 that overlay the interconnect stripe and also protects portions that are adjacent to or align with the interconnect stripe, that is, portions along a line that extends from the principle axis of the interconnect stripe. As shown in FIG. 2, reticle 30 protects a first or unexposed portion that includes photoresist mask elements 22, 23, 24, and 26. The unexposed portion also includes portions of photoresist 21 that align with elements 22, 23, 24, and 26 as illustrated by dashed lines 27 and 28. The remainder of photoresist 21 forms a second or exposed portion of photoresist 21.

After the stepper exposure is complete, a third portion of photoresist 21, the portion between photoresist mask elements 22, 23, 24, and 26, illustrated by dashed lines 27 and 28, is exposed by using contact mask 31. Contact mask 31 exposes the portion of photoresist 21 indicated by dashed lines 27 and 28 but protects the portions corresponding to elements 22, 23, 24, and 26. Such a contact mask is generally referred to as a dark field mask. Mask 31 may also expose other previously exposed portions of photoresist 21. Consequently, the contact mask exposure facilitates dividing photoresist 21 into separate photoresist mask elements 22 and 23 for device 10, and photoresist mask elements 24 and 26 for device 15. In the preferred embodiment, contact mask 31 is used in a proximity mode so that mask 31 is less than ten microns from the surface of photoresist 21. After the stepper and contact mask exposures have been completed, photoresist 21 is developed, and exposed portions are removed thereby leaving elements 22, 23, 24, and 26 on layer 17.

Figure 3:
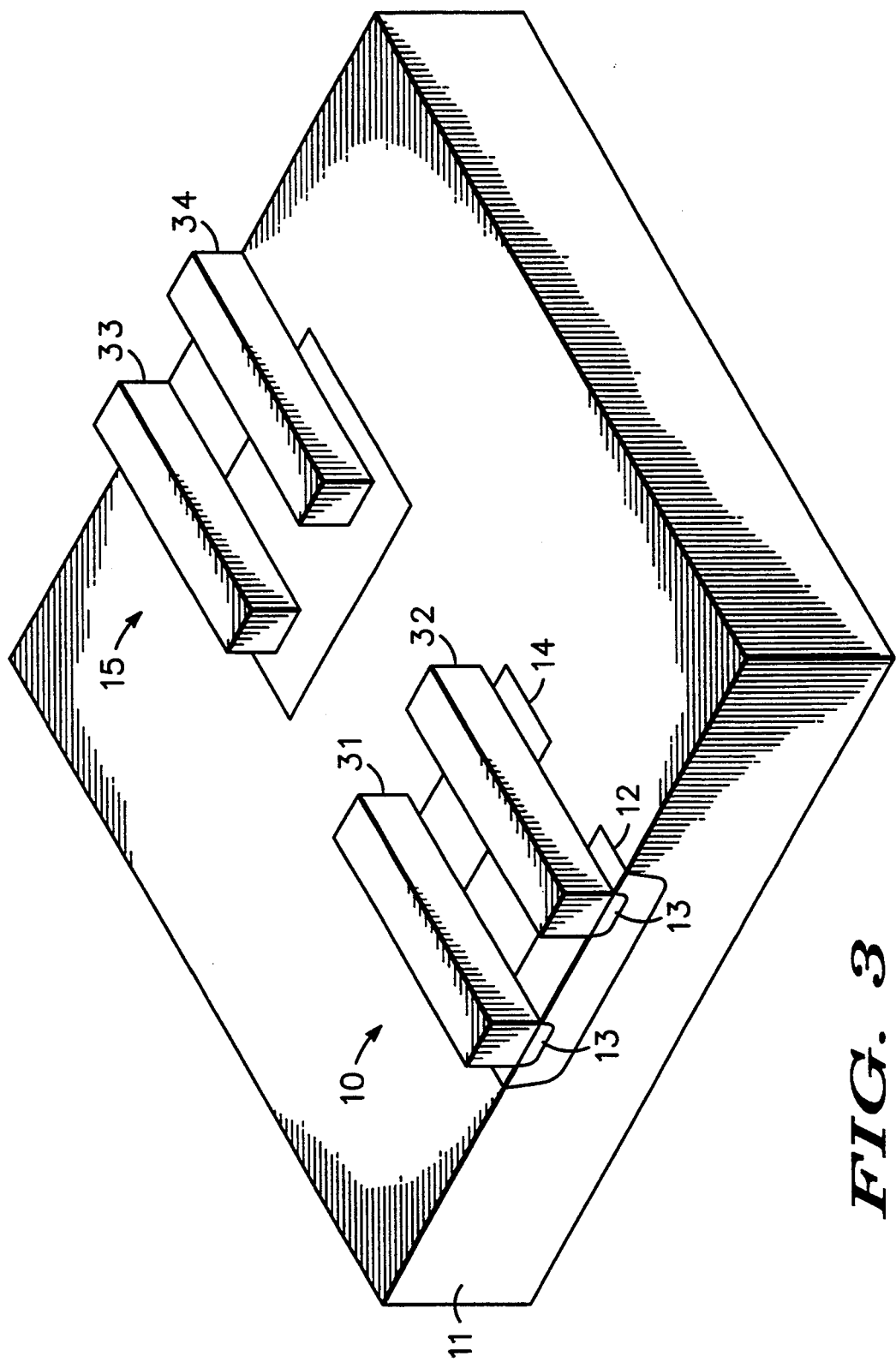
FIG. 3 illustrates the semiconductor device of FIG. 2 after forming an interconnect pattern in accordance with the present invention.

FIG. 3 illustrates an enlarged perspective view of devices 10 and 15 after using elements 22, 23, 24, and 26 to remove portions of interconnect layer 17 not covered by elements 22, 23, 24, and 26 (FIG. 2). Portions of FIG. 3 that are the same as FIGS. 1 and 2 have the same reference numerals. The removed portions of metal layer 17 (FIG. 2) are removed by etching techniques that are well known in the semiconductor art are used for removing the portions of layer 17 not covered by elements 22, 23, 24, and 26 (FIG. 2). After the etching is complete conductors 31 and 32 remain to electrically connect elements 12 and 14 of device 10, and conductors 33 and 34 remain to electrically connect elements of device 15. Additionally, device 10 is now separated from device 15 and from other semiconductor devices on wafer 11. It should be noted that the herein described method could also be used for patterning a semiconductor wafer or a semiconductor substrate having other layers on a semiconductor wafer during the formation of a semiconductor device.

By now it should be appreciated that there has been provided a novel way to fabricate a semiconductor device. Utilizing a stepper reticle that does not separate elements on a wafer into individual semiconductor devices facilitates using only one stepper reticle. Using one stepper reticle lowers manufacturing time and cost over prior methods of separating patterns into two separate stepper reticles. Using a single contact mask for the entire wafer in order to further expose the photoresist and separate the wafer into individual semiconductor devices also saves manufacturing time and manufacturing cost since a contact mask is less expensive than a stepper reticle and uses less exposure time than a stepper reticle.

I claim:

1. A method of forming a semiconductor device comprising:

applying a layer of photoresist to a semiconductor substrate;

protecting a first portion of the photoresist while exposing a second portion of the photoresist by using a first mask;

exposing a third portion of the photoresist prior to developing the photoresist by using a second mask wherein the third portion of the photoresist includes part of the first portion of the photoresist; and developing the photoresist to form a photoresist mask.

2. The method of claim 1 further including removing portions of the semiconductor substrate not covered by the photoresist mask.

3. The method of claim 1 wherein applying the layer of photoresist to the semiconductor substrate includes using a semiconductor substrate having a plurality of unconnected semiconductor elements formed on the substrate.

4. The method of claim 1 wherein applying the layer of photoresist to the semiconductor substrate includes using a semiconductor substrate having a plurality of unconnected transistors formed on the substrate.

5. The method of claim 1 wherein the step of protecting the first portion of the photoresist includes using a stepper reticle as the first mask.

6. The method of claim 1 wherein the step of exposing the third portion of the photoresist includes using a contact mask as the second mask.

7. The method of claim 6 wherein using the contact mask includes using the contact mask in a proximity mode.

8. The method of claim 7 wherein using the contact mask in the proximity mode includes positioning the contact mask less than ten microns from the semiconductor substrate.

9. A method of forming a semiconductor device comprising:

providing a semiconductor wafer having a plurality of unconnected transistors;

forming a conductor layer on the semiconductor wafer wherein a portion of the conductor layer forms a transistor interconnect stripe that connects the plurality of unconnected transistors;

applying a layer of photoresist to the conductor layer;

protecting a first portion of the photoresist overlying both the interconnect stripe and an area adjacent the interconnect stripe while exposing a second portion of the photoresist by using a first mask;

exposing a third portion of the photoresist that includes part of the first portion of the photoresist wherein the exposing is performed prior to developing the photoresist and is performed by using a second mask; and developing the photoresist to form a photoresist mask.

10. The method of claim 9 further including removing portions of the conductor layer not covered by the photoresist mask.

11. The method of claim 9 wherein forming the conductor layer on the semiconductor wafer includes forming a metal layer on the semiconductor wafer.

12. The method of claim 9 wherein the step of protecting the first portion of the photoresist includes using a stepper reticle to perform the exposing.

13. The method of claim 9 wherein the step of exposing the third portion of the photoresist includes using a contact mask.

14. The method of claim 9 wherein protecting the first portion of the photoresist overlying both the interconnect stripe and the area adjacent the interconnect stripe includes protecting a portion of the photoresist overlaying a line extending from a principle axis of the interconnect stripe.

15. A method of forming a transistor comprising:
providing a semiconductor wafer having a plurality of unconnected transistors arranged in a row;
forming a metal layer on the semiconductor wafer wherein a portion of the metal layer forms an interconnect stripe for electrically connecting the plurality of unconnected transistors;
applying a layer of photoresist to the metal layer;
protecting a first portion of the photoresist overlaying the interconnect stripe and overlaying an area adjacent the interconnect stripe while exposing a second portion of the photoresist not overlaying the interconnect stripe by using a first mask;
exposing a third portion of the photoresist by using a second mask wherein the third portion of the photoresist includes part of the first portion of the photoresist;
developing the photoresist to form a photoresist mask; and
removing portions of the metal layer not covered by the photoresist mask.

16. The method of claim 15 wherein protecting the first portion of the photoresist includes using a stepper reticle.

17. The method of claim 15 wherein exposing the third portion of the photoresist includes using a contact mask.

18. The method of claim 17 wherein using the contact mask includes using the contact mask in a proximity mode.

19. The method of claim 18 wherein using the contact mask in the proximity mode includes having the contact mask less than ten microns from the layer of photoresist.

* * * * *